(12) United States Patent
Jung

(10) Patent No.: US 7,576,825 B2
(45) Date of Patent: Aug. 18, 2009

(54) CHIP ON GLASS TYPE LIQUID CRYSTAL DISPLAY DEVICE AND METHOD FOR FABRICATING THE SAME

(75) Inventor: Tae Woo Jung, Ulsan-kwangyokshi (KR)

(73) Assignee: LG. Display Co., Ltd., Seoul (KR)

( * ) Notice: Subject to any disclaimer, the term of this patent is extended or adjusted under 35 U.S.C. 154(b) by 545 days.

(21) Appl. No.: 11/115,793

(22) Filed: Apr. 27, 2005

(65) Prior Publication Data

US 2005/0243234 A1    Nov. 3, 2005

(30) Foreign Application Priority Data

Apr. 28, 2004  (KR) .................. 10-2004-0029430

(51) Int. Cl.
*G02F 1/1345* (2006.01)
(52) U.S. Cl. .................................... 349/152
(58) Field of Classification Search ......... 349/149–152, 349/122, 187, 138; 257/72
See application file for complete search history.

(56) References Cited

U.S. PATENT DOCUMENTS

| | | | | |
|---|---|---|---|---|
| 4,832,455 A | * | 5/1989 | Takeno et al. ............ | 349/149 |
| 5,286,337 A | * | 2/1994 | Tsou ....................... | 216/23 |
| 5,883,682 A | * | 3/1999 | Kim et al. ................ | 349/43 |
| 6,051,150 A | * | 4/2000 | Miyakawa ................ | 216/67 |
| 6,111,628 A | * | 8/2000 | Shiota et al. ............. | 349/150 |
| 6,288,414 B1 | * | 9/2001 | Ahn ........................ | 257/72 |
| 6,646,708 B1 | * | 11/2003 | Muramatsu .............. | 349/149 |
| 6,781,109 B2 | * | 8/2004 | Izumi et al. .............. | 250/214.1 |
| 2003/0016308 A1 | * | 1/2003 | Jeon ........................ | 349/39 |

FOREIGN PATENT DOCUMENTS

JP    01281433 A   * 11/1989

* cited by examiner

*Primary Examiner*—Thoi V Duong
(74) *Attorney, Agent, or Firm*—Brinks Hofer Gilson & Lione

(57) ABSTRACT

A chip on glass type liquid crystal display device and a method for fabricating the same are provided in which a surface of a pad electrode for attaching a flexible printed circuit film is embossed to increase an adhesive force between a pad electrode and a flexible printed circuit film, thereby ensuring contact between the pad electrode and the flexible printed circuit film. Unit pixels in an active region contain thin film transistors formed at intersections of gate lines and data lines. A pad electrode is formed in an inactive region. An embossing pattern is formed on the pad electrode. An adhesive is provided on the pad electrode including the embossing pattern and an external drive circuit part is connected to the pad electrode by the adhesive.

14 Claims, 8 Drawing Sheets

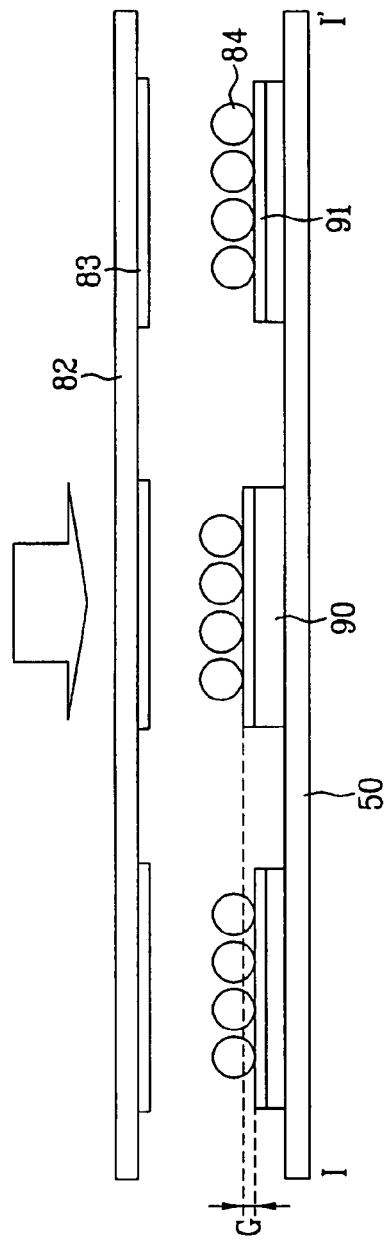
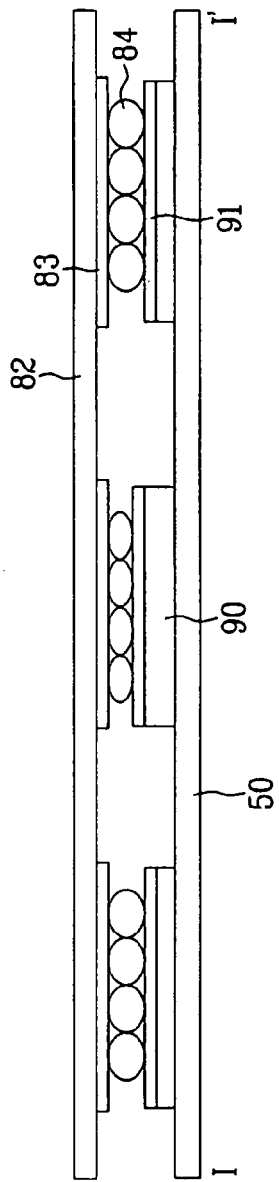
FIG. 2A Related Art
FIG. 2B Related Art

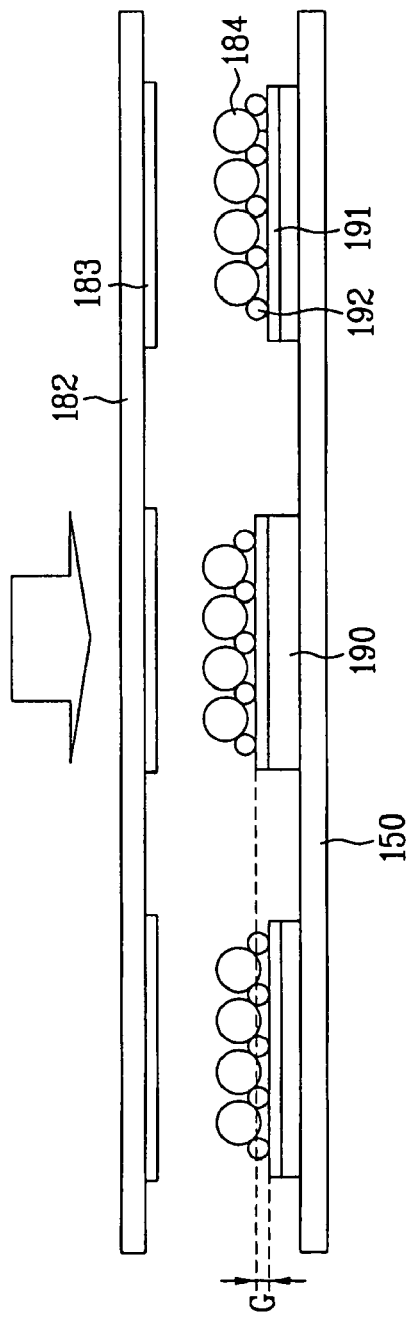

CHIP ON GLASS TYPE LIQUID CRYSTAL DISPLAY DEVICE AND METHOD FOR FABRICATING THE SAME

This application claims the benefit of the Korean Application No. P2004-29430 filed on Apr. 28, 2004, which is hereby incorporated by reference.

FIELD OF THE INVENTION

The present invention relates to a liquid crystal display device, and more particularly, to a chip on glass type liquid crystal display device and a method for fabricating the same, in which adhesive force between a pad electrode of a substrate and a flexible printed circuit film is enhanced.

DISCUSSION OF THE RELATED ART

A liquid crystal display device has large contrast ratio and low power consumption such that it is adapted to represent a gray scale and display a moving picture. For these reasons, the liquid crystal display device is widely used as a flat display device.

The liquid crystal display device includes a color filter substrate having a color filter layer for color representation, a thin film transistor (TFT) array substrate facing the color filter substrate, a liquid crystal layer interposed between the color filter substrate and the TFT array substrate, and a drive circuit for driving the TFT array substrate. In such a configuration, the liquid crystal display device displays an image in accordance with various external signals.

Also, the TFT array substrate includes gate lines and data lines for transferring various signals to pixels defined by vertical intersections thereof, TFTs for selectively applying signals to pixel electrodes, and storage capacitors for maintaining charged states until unit pixel regions are addressed.

The drive circuit includes a gate drive for driving the gate lines, a data drive for driving the data lines, a timing controller for controlling the gate drive and the data drive, and a voltage generator for generating drive voltages, such as a common voltage (Vcom), a gate high voltage (Vgh) and a gate low voltage (Vgl).

The gate drive sequentially supplies a scanning signal to the gate lines to sequentially drive the pixels line by line. The data drive supplies a pixel voltage signal to the data lines until the scanning signal is supplied to one of the gate lines.

In this manner, the liquid crystal display device displays an image by adjusting a transmittance in accordance with an electric field applied between a pixel electrode and a common electrode depending on a pixel voltage signal in each liquid crystal cell.

Each of the data drive and the gate drive is integrated in a form of integrated circuits (ICs).

Each of the integrated data drive IC and the integrated gate drive IC is classified into a tape automated bonding (TAB) type where each drive IC is packaged on a tape carrier package (TCP) and connected to a liquid crystal panel, and a chip on glass (COG) type where each drive IC is directly packaged on the TFT array substrate.

In the case of the COG type liquid crystal display device, a flexible printed circuit (FPC) film is adhered for supplying signals to the drive ICs. The FPC film includes lines through which electric signals can be supplied to all the drive ICs.

The COG type liquid crystal display device will now be described in detail.

FIG. 1 is a plan view of a conventional COG type liquid crystal display device, and FIGS. 2A and 2B are sectional views taken along line I-I' of FIG. 1, showing a process of attaching an FPC film.

Referring to FIG. 1, a TFT array substrate 50 is divided into an active region 52 disposed inside a dotted line and a pad region 54 disposed outside of the dotted line.

A plurality of gate lines 61 and a plurality of data lines 62 are formed within the active region 52. Also, the gate lines and the data lines are intersected to define unit pixels.

A TFT is formed at each intersection region of the gate lines 61 and the data lines 62. Also, a pixel electrode 10 connected to a drain electrode of the TFT is formed at each pixel region. Accordingly, an image is displayed on each pixel region by the switching operation of the TFTs.

The pad region includes gate pads 63 and data pads 64 through which external signals for driving the TFTs are supplied, gate drive ICs 70 packaged to be electrically connected to the gate pads 63 and the gate lines 61, and data drive ICs 80 packaged to be electrically connected to the data pads 64 and the data lines 62.

Each of the gate drive ICs 70 includes input bumps electrically connected to the gate pad 63 and (not shown) and output bumps (not shown) electrically connected to a terminal that is extended from the gate line 61. Each of the gate drive ICs 70 generates a scanning signal in response to a gate control signal applied through the input bump to the gate pad 63, and supplies the scanning signal through the output bump to the gate line 63.

Each of the data drive ICs 80 includes input bumps electrically connected to the data pad 64 and (not shown) and output bumps (not shown) electrically connected to a terminal that is extended from the data line 62. Each of the data drive ICs 80 generates a pixel voltage signal in response to a data control signal applied through the input bump to the data pad 64, and supplies the pixel voltage signal through the output bump to the data line 62.

The gate pads 63 and the data pads 64 are respectively connected to the data drive ICs 70 and the data drive ICs 80 and receive signals for driving the TFTs.

For this purpose, as shown in FIG. 2, the gate pads 63 and the data pads 64 are formed of a stacked layer, including a pad electrode 90 and a transparent conductive layer 91, on the pad region 54 of the TFT array substrate 50. Each of the gate pads 63 and the data pads 64 is electrically connected to a terminal 83 of an FPC film 82 through conductive balls 84 of an anisotropic conductive film (ACF). The FPC film 82 includes lines for transferring electric signals (e.g., video data, timing control signals, and voltage signals) from a control circuit (not shown) to the drive ICs 70 and 80.

A process of attaching the FPC film 82 will now be described with reference to FIGS. 2A and 2B.

Referring to FIG. 2A, ACFs 84 are attached on the pads 63 and 64 including the pad electrodes 90 and the transparent conductive layer 91 formed on the pad region of the substrate 50. The ACFs 84 have a structure where conductive spheres (conductive balls) covered with a thin insulating layer are dispersed on an adhesive resin.

The pad electrodes 90 of the pads 63 and 64 are formed together with the gate lines 61 or data lines 62 of the active region at the same time. The transparent conductive layers 91 are formed together with the pixel electrodes 10 of the active region at the same time. At this point, due to process error or lack of processing technique, the thickness of the pad electrodes 90 may be different from that of the transparent conductive layers 91, causing a step G.

Referring to FIG. 2B, the FPC film 82 is attached at a predetermined temperature and pressure on each pad 63 and 64 where the ACF 84 is attached. Then, the adhesive resin of the ACF 84 is melted and thus the conductive ball 84 is electrically connected between the terminal 83 of the FPC film 82 and the transparent conductive layer 91. Accordingly, the electric signals from the FPC film 82 are supplied to the gate drive IC 70 and the data drive IC 80 through the terminal 83 of the FPC film 82, the conductive ball 84, the transparent conductive layer 91, the pad electrode 90 and the input bump.

As described above, however, the step occurs between the pad electrodes 90 of the pads 63 and 64. Therefore, in the pad located at a relatively low position, contact between the terminal 83 of the FPC film 82 and the transparent conductive film 91 may not occur. If no contact exists, the electric signals of the FPC film 82 cannot be transferred to the drive ICs 70 and 80. Consequently, the driving of the liquid crystal display device is not achieved correctly.

These problems occur more often under a high-temperature high-humidity environment because the adhesive state of the ACF 84 is more degraded in that condition.

SUMMARY OF THE INVENTION

By way of introduction only, in one aspect a display device includes: an active region including a plurality of unit pixels on which thin film transistors are formed at intersections of gate lines and data lines; a pad electrode formed in an inactive region; an embossing pattern formed on the pad electrode; an adhesive provided on the pad electrode including the embossing pattern; and an external drive circuit part connected to the pad electrode by the adhesive.

The embossing pattern may be formed by performing plasma surface process on a transparent conductive layer provided on the pad electrode or may be formed by patterning an organic insulating layer on a transparent conductive layer on the pad electrode including the embossing pattern. The adhesive may be an anisotropic conductive film. The external drive circuit part may be a drive IC or a flexible printed circuit film.

In another aspect of the present invention, a method for fabricating a chip on glass type liquid crystal display device includes: forming gate lines and data lines in an active region of a substrate, and forming thin film transistors at intersections of the gate lines and the data lines; forming a pad electrode in an inactive region; embossing a surface of the pad electrode; providing an adhesive on the pad electrode; and pressing an external drive circuit part such that the external drive circuit part is connected to the pad electrode by the adhesive.

Embossing the surface of the pad electrode may include forming a transparent conductive layer on the pad electrode and performing $H_2$ plasma process or He ashing process on a surface of the transparent conductive layer. Alternatively, embossing the surface of the pad electrode may include: forming embossing pattern on the pad electrode and forming a transparent conductive layer on the pad electrode along a surface of the embossing pattern. In this case, the embossing pattern may be formed by patterning an insulating layer formed on an entire surface including the thin film transistor.

In one aspect, the drive ICs and the FPC film are packaged on the substrate at the same time in the display device. Since the surface of the pad electrode where the FPC film is attached is embossed, it is possible to prevent non-contact that is caused by the step non-uniformity between the pad electrodes.

The non-contact occurs more often under high-temperature high-humidity environment. The process of embossing the surfaces of the pad electrodes compensates for the step non-uniformity and increases the contact surface area, such that the adhesive force can be kept under any environments.

The embossing process can be achieved by applying various processes. For example, the surface of the pad electrode or the transparent conductive layer stacked on the pad electrode can be made roughly by $H_2$ plasma process or He ashing process. Alternatively, the surface can be made roughly by forming a separate embossing pattern on the pad electrode.

In another embodiment, a display device substrate includes: an active region in which a plurality of unit pixels on which switches are formed at intersections of gate lines and data lines; an inactive region in which a plurality of pad electrodes having different thicknesses are formed; and an embossing pattern on the pad electrodes. The embossing pattern may be larger than the maximum thickness difference between the pad electrodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 2A and 2B are sectional views taken along line II-II' of FIG. 1, showing a process of attaching an FPC film;

FIGS. 5A and 5B are sectional views illustrating a process of attaching an FPC film according to the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
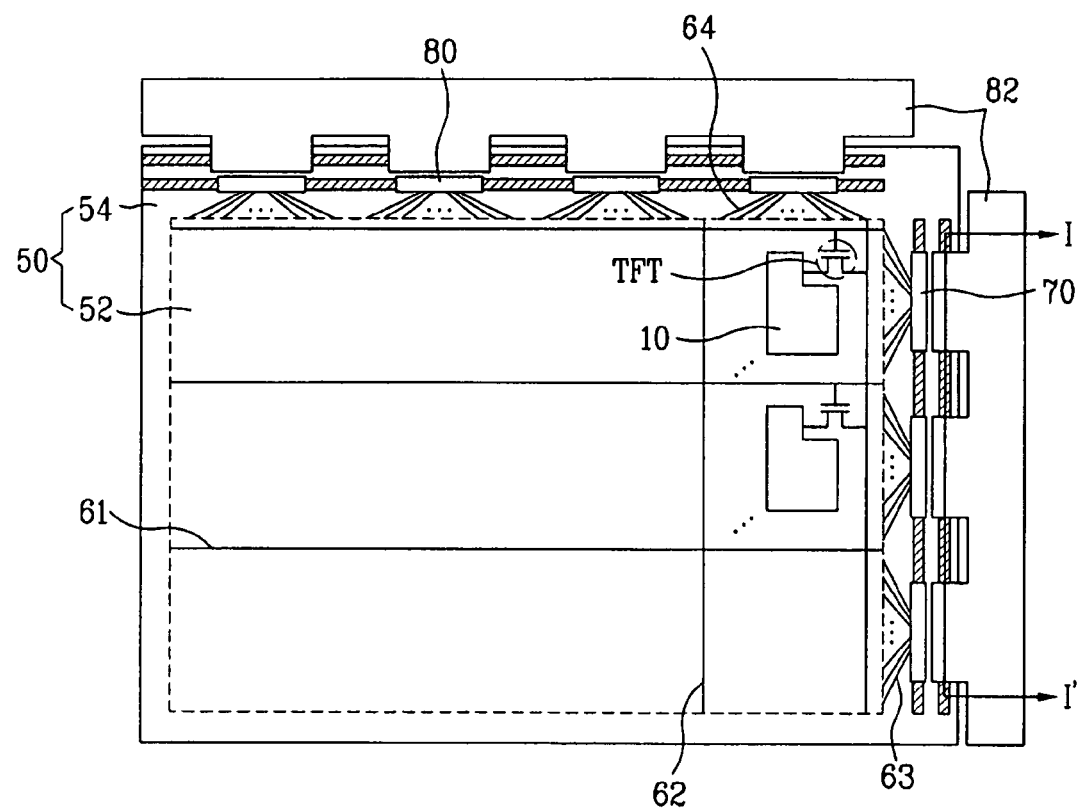
FIG. 1 is a plan view of a conventional COG type liquid crystal display device.
Figure 3:
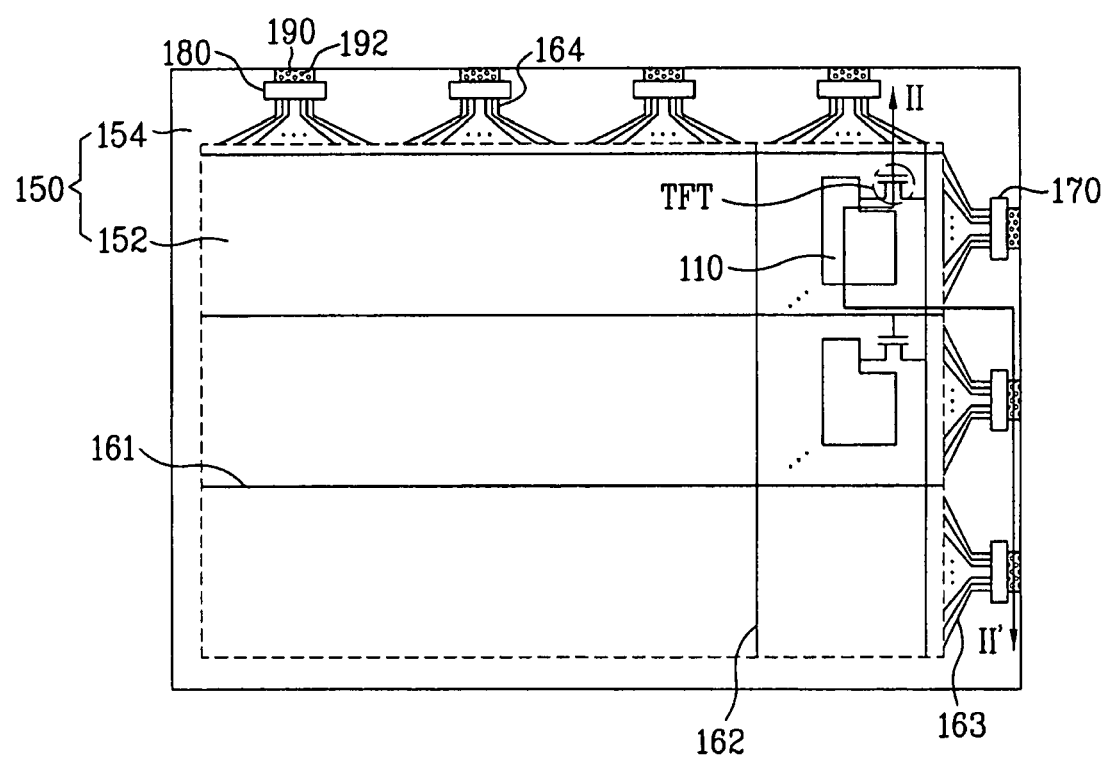
FIG. 3 is a plan view of a liquid crystal display device according to a first embodiment of the present invention.
Figure 4:
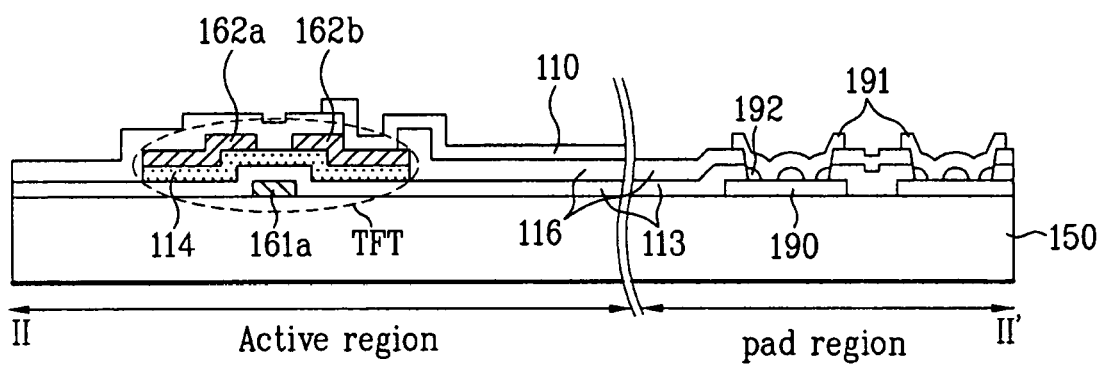
FIG. 4 is a sectional view taken along line II-II' of FIG. 3.
Figure 7:
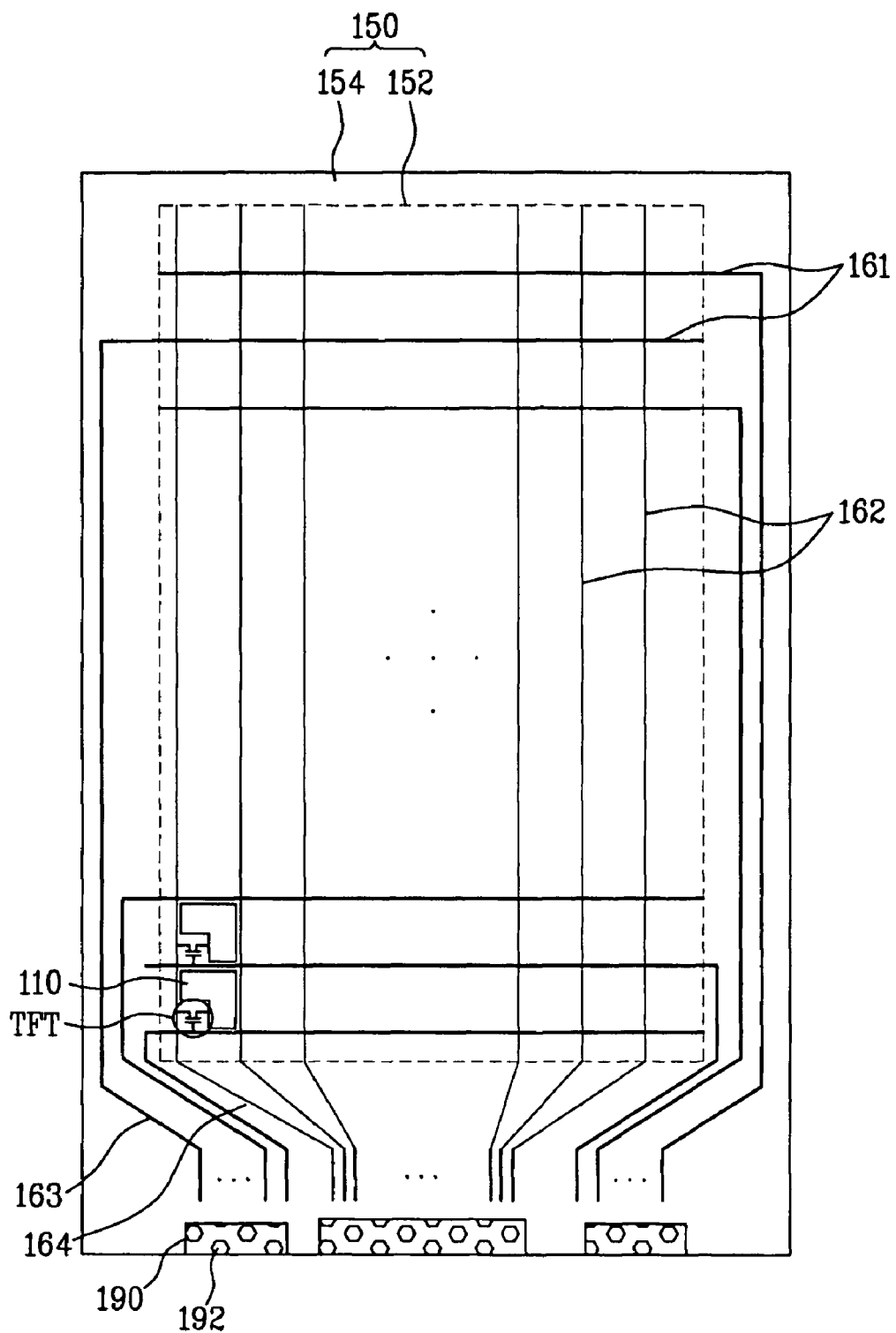
FIG. 7 is a plan view of a liquid crystal display device according to a second embodiment of the present invention.

FIG. 3 is a plan view of a liquid crystal display device according to a first embodiment of the present invention; FIG. 4 is a sectional view taken along line II-II' of FIG. 3; FIGS. 5A and 5B are sectional views illustrating a process of attaching an FPC film according to the present invention; and FIG. 7 is a plan view of a liquid crystal display device according to a second embodiment of the present invention.

Referring to FIGS. 3 and 4, a TFT array substrate 150 where TFTs are formed is divided into an active region 152 and a pad region 154.

In the active region 152, gate lines 161 are formed to transfer a scanning signal. Also, data lines 162 are vertically intersected with the gate lines 161 to define pixels. A pixel voltage signal is transferred through the data lines 162. TFTs are formed at intersections of the gate lines 161 and the data lines 162. Each of the TFTs includes a gate electrode 161a, a gate insulating layer 113, a semiconductor layer 114, and source/drain electrodes 162a and 162b. A pixel electrode 110 is connected to the TFT, with a passivation layer 116 being interposed therebetween.

The gate line 161 and the data line 162 are formed of metal having a good electrical conductivity and a low resistance. The gate insulating layer 113 is formed of inorganic insulating material, such as a silicon oxide ($SiO_x$) or a silicon nitride ($SiN_x$). The passivation layer 116 is formed of organic insulating layer, such as Benzocyclobutene (BCB) and acryl resin.

In the pad region 154, gate pads 163 and data pads 164 are formed to transfer external signals for driving the TFTs. Also, gate drive ICs 170 are packaged to be electrically connected to the gate pads 163 and the gate lines 161. Data drive ICs 180 are packaged to be electrically connected to the data pads 164 and the data lines 162.

Each of the gate drive ICs 170 includes input bumps electrically connected to the gate pad 163 and (not shown) and output bumps (not shown) electrically connected to a terminal that is extended from the gate line 161. Each of the gate drive ICs 170 generates a scanning signal in response to a gate control signal applied through the input bump to the gate pad 163, and supplies the scanning signal through the output bump to the gate line 163.

Each of the data drive ICs 180 includes input bumps electrically connected to the data pad 164 and (not shown) and output bumps (not shown) electrically connected to a terminal that is extended from the data line 162. Each of the data drive ICs 180 generates a pixel voltage signal in response to a data control signal applied through the input bump to the data pad 164, and supplies the pixel voltage signal through the output bump to the data line 162.

The gate pads 163 and the data pads 164 are respectively connected to the data drive ICs 170 and the data drive ICs 180 and receive signals for driving the TFTs.

For this purpose, as shown in FIG. 4, the gate pads 163 and the data pads 164 are formed of a stacked layer, including a pad electrode 190 and a transparent conductive layer 191, on the pad region 154 of the TFT array substrate 150. Each of the gate pads 163 and the data pads 164 is electrically connected to a terminal 183 of an FPC film 182 through conductive balls 184 of an anisotropic conductive film (ACF). The FPC film 182 includes lines for transferring electric signals (e.g., video data, timing control signals, and voltage signals) from a control circuit (not shown) to the drive ICs 170 and 180.

More specifically, the FPC film 182 is attached to the stacked layer of the pad electrode 190 and the transparent conductive layer 191, which are formed in the pad region of the TFT array substrate 150. An embossing pattern 192 is formed on the pad electrode 190 in order to compensate for step non-uniformity between the FPC film 182 and the stacked layer and enhance the adhesive force.

Accordingly, the embossing pattern 192 increases a contact surface area between the stacked layer and the FPC film 182 and compensates for step non-uniformity, so that as shown in FIG. 5A and 5b non-contact between the pads 163 and 164 and the FPC film 182 is prevented.

The embossing pattern 192 can be formed by making a surface of the transparent conductive layer 191 rough using $H_2$ plasma process or He ashing process on the surface thereof. Also, the embossing pattern 192 can be formed by inserting an embossing pattern on the pad electrode 190 and then depositing the transparent conductive layer 191.

In the latter method, the embossing pattern 192 formed on the pad electrode 190 can be formed together with the passivation layer 116 of the active region at the same time. Therefore, an additional process is not required. Since the pad electrode 190 is formed of a low resistance material having a good electrical conductivity, the processes can be reduced by forming the pad electrode 190 together with the gate line 161 and the data line 162 at the same time. Also, since the transparent conductive layer 191 is formed of material having a good electrical conductivity and is not easily oxidized, the processes can be reduced by forming the transparent conductive layer 191 together with the pixel electrode 110 of the active region at the same time.

A method for fabricating the liquid crystal display device will now be described in detail.

FIGS. 6A to 6D are sectional views illustrating a method for fabricating a liquid crystal display device according to the present invention.

Figure 6A:
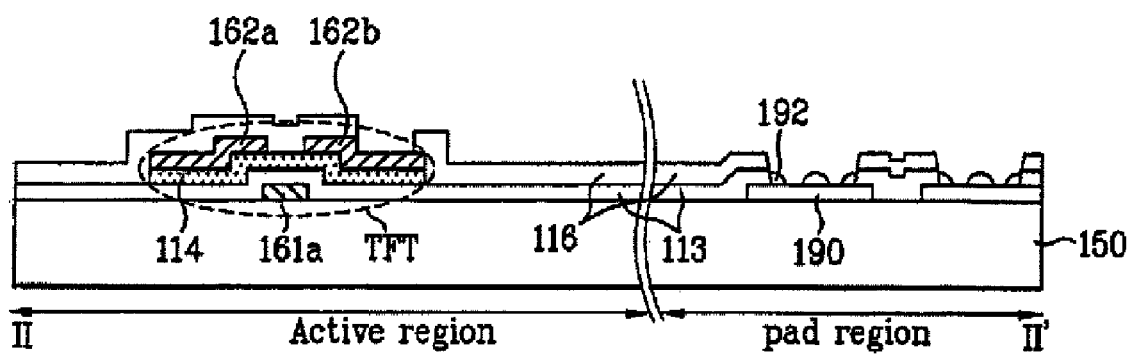
FIGS. 6A to 6D are sectional views illustrating a method for fabricating a liquid crystal display device according to the present invention.

Referring to FIG. 6A, in order to prevent signal delay, metal having a low specific resistance is deposited on a substrate 150 and patterned to form gate lines 161 and gate electrodes 161a in an active region and to form pad electrodes 190 in a pad region.

Though the pad electrodes 190 includes a pad electrode where the gate drive IC 170 is connected to the substrate 150 and a pad electrode where the FPC film 182 is connected to the substrate 150, only the pad electrode 190 to which the FPC film 182 is connected is illustrated in FIG. 6A.

Next, a gate insulating layer 113 is formed by depositing inorganic insulating material, such as silicon oxide ($SiO_x$) or silicon nitride ($SiN_x$), on an entire surface including the gate lines 161 by using plasma enhanced chemical vapor deposition (PECVD). An amorphous silicon (a-Si) layer is deposited at high temperature on an entire surface including the gate insulating layer 113. Then, the amorphous silicon layer is patterned to form a semiconductor layer 114 on the gate electrode 161a.

Then, low resistance metal is deposited on an entire surface including the semiconductor layer 114 and is patterned to form data lines 162 and source/drain electrodes 162a and 162b. At this point, the pad electrode may be formed.

The gate lines and the data lines can be formed of low resistance material, such as copper (Cu), aluminum (Al), Aluminum neodymium (AlNd), molybdenum (Mo), chrome (Cr), titanium (Ti), tantalum (Ta), and molybdenum-tungsten (MoW).

In this manner, a TFT including the gate electrode 161a, the gate insulating layer 113, the semiconductor layer 114, and U-shaped source/drain electrodes 162a and 162b is provided.

Organic insulating material, such as benzocyclobutene (BCB) and acryl resin, are coated on an entire surface including the TFT and is patterned to form the passivation layer 116 and the embossing pattern 192. By forming the embossing pattern 192 on the pad electrode 190, it is possible to compensate for step between the pad electrodes 190, which is caused by process error, and to increase contact surface area.

Figure 6B:
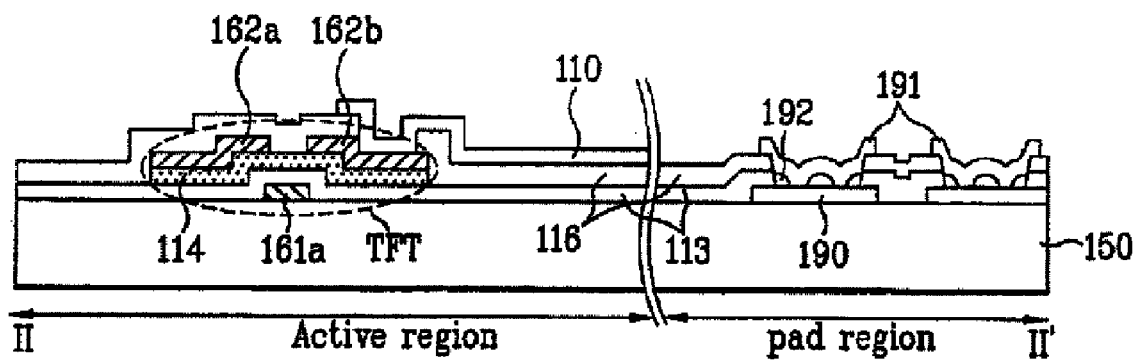

Referring to FIG. 6B, a transparent conductive material, such as indium tin oxide (ITO) or indium zinc oxide (IZO), is deposited on an entire surface including the passivation layer 116 and is patterned to form the pixel electrode 110 and the transparent conductive layer 191. The pixel electrode 110 passes through the passivation layer 116 and is electrically connected to the drain electrode 162b. The transparent conductive layer 191 is formed along the embossing pattern 192 such that the pad electrode 190 is covered.

Figure 6C:
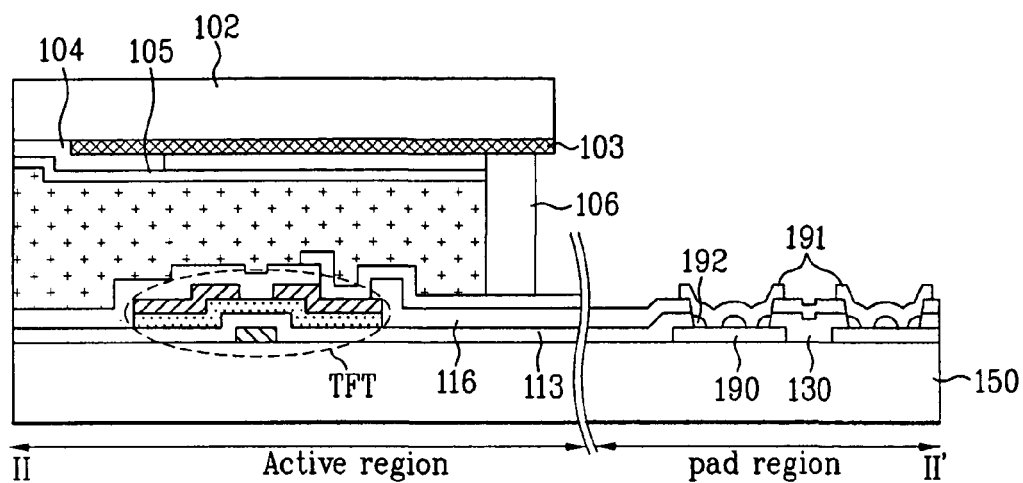

Referring to FIG. 6C, a sealant 106 is formed at an edge of a TFT array substrate 150 in such a state that the pad region is exposed, and a color filter array substrate is bonded with the TFT array substrate 150 facing it. Then, a liquid crystal layer 101 is formed between the TFT array substrate and the color filter array substrate 102. The color filter array substrate 102 includes a black matrix 103 for preventing light leakage, a color filter layer 104 where red, green and blue color resists are formed in a predetermined order, and a common electrode 105 formed on the color filter layer 104 to form an electric field together with the pixel electrode 110 of the TFT array substrate 150.

Figure 6D:
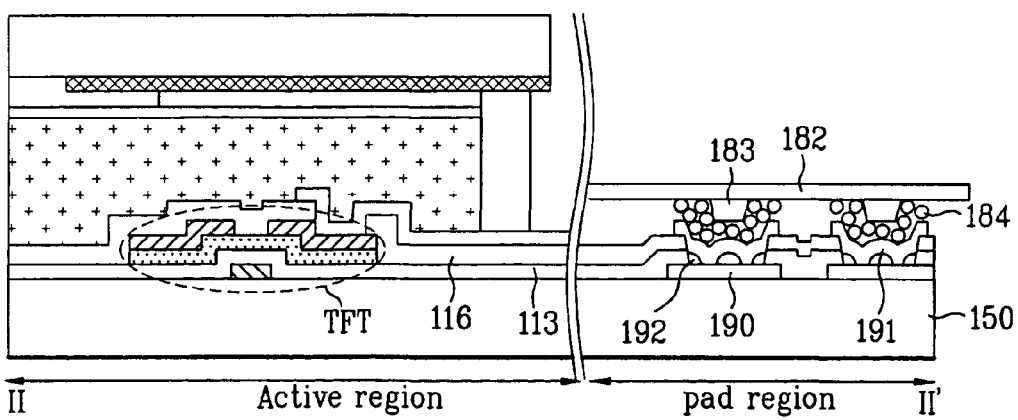

Referring to FIG. 6D, an FPC film 182 is attached on the pad region of the TFT array substrate 150.

An ACF 184 is attached on the substrate 150 corresponding to the pad electrode 190. The ACF 184 includes an adhesive resin where conductive balls are dispersed. The ACF 184 and the FPC film 182 are attached using a provisional press and a main press. Accordingly, when the ACF 184 is pressed on the terminal 183 of the FPC 182 and the pad electrode 190, the conductive balls are broken and the terminal 183 and the pad electrode 190 are electrically shorted.

Since the prominence is formed by the embossing pattern in a region where the terminal 183 of the FPC 183 is contacted, step non-uniformity of the pad electrode 190 is compensated and the contact surface area increases to improve the adhesive duration.

The drive ICs 170 and 180 are packaged on the substrate before or at the same time when the FPC film 182 is attached. That is, the drive ICs 170 and 180 are attached spaced away by a predetermined distance in the region where the FPC film 182 is attached. Also, the drive ICs 170 and 180 are packaged on the substrate by the ACF. Non-contact can be prevented by forming the embossing patterns on the pad electrodes attached to the drive ICs 170 and 180.

The chip on glass (COG) method is used to directly package the drive ICs 170 and 180 and the FPC film 182 on a glass substrate using the ACF. Compared with the tape automated bonding (TAB) method, the COG method uses a relatively simple structure and a ratio occupied by the liquid crystal panel can be increased.

Meanwhile, though large or medium liquid crystal panel used as display device of notebook computer or TV is described in the first embodiment of the present invention, the present invention can also be applied to a small panel such as a display device of a handheld terminal.

In the case of the small panel, as shown in FIG. 7, the gate pads and the data pads are all arranged in a lower portion of the liquid crystal panel so as to minimize a size of the pad region.

The data lines 162 are connected to one data drive IC through data link line 164. Also, the gate lines 161 are connected through data link line 163 to the gate drive ICs arranged on both sides of the data drive IC.

The gate drive IC arranged at the left side of the data drive IC is connected to an odd gate line, while the gate drive IC arranged at the right side of the data drive IC is connected to an even gate line.

Outside the gate drive IC and the data drive IC, the FPC film is packaged spaced apart from the gate drive IC and the data drive IC by a predetermined distance. The drive ICs and the FPC film are directly attached on the pad region 154 of the TFT array substrate 150 using the ACF.

When the FPC film is directly attached to the pad electrode formed in the pad region 154 of the TFT array substrate 150, the embossing pattern 192 is further provided on the pad electrode 190 so as to compensate for step non-uniformity and increase the adhesive force.

Since the embossing pattern 192 increases the contact surface area and compensates for the step non-uniformity (G), non-contact can be prevented when the FPC film is pressed and attached.

The present invention provides the COG type liquid crystal display device where the drive ICs and the FPC film are packaged on the substrate at the same time. Since the surface of the pad electrode where the FPC film is attached is embossed, it is possible to prevent non-contact caused by the step non-uniformity between the pad electrodes.

Further, non-contact occurs more often under high-temperature high-humidity environment. The process of embossing the surfaces of the pad electrodes compensates for the step non-uniformity and increases the contact surface area, such that the adhesive force can be kept under any environments.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A display device comprising:
    a substrate defined of an active region and a pad region;
    a pad electrode formed on the substrate in the pad region;
    an insulating layer formed on the substrate, the insulating layer having a contact hole on the pad electrode;
    a passivation layer formed on the insulating layer;
    a plurality of embossing patterns comprised of an organic insulating material formed on the contact hole and a side of the insulating layer;
    a transparent conductive layer formed over the pad electrode;
    an adhesive provided over the pad electrode; and
    an external drive circuit part connected to the pad electrode by the adhesive.

2. The display device of claim 1, wherein the transparent conductive layer is disposed on and between the plurality of embossing patterns.

3. The display device of claim 1, wherein the insulating layer comprises an inorganic insulating material.

4. The display device of claim 1, wherein the passivation layer comprises the organic insulating material.

5. The display device of claim 1, wherein the transparent conductive layer contacts the pad electrodes between the plurality of embossing patterns.

6. The display device of claim 1, wherein the adhesive is an anisotropic conductive film.

7. The display device of claim 1, wherein the external drive circuit part is a drive IC or a flexible printed circuit film.

8. The display device of claim 1, wherein the display device is a chip on glass type liquid crystal display device.

9. A method for fabricating a display device, the method comprising:
    Preparing a substrate having an active region and a pad region;
    forming gate lines and data lines in the active region of the substrate, and forming switches at intersections of the gate lines and the data lines;
    forming a pad electrode in the pad region;
    forming a insulating layer having a contact hole on the pad electrode;
    forming a passivation layer on the insulating layer;

forming a plurality of embossing patterns comprised of an organic insulating material on the contact hole and a side of the insulating layer;

providing an adhesive over the pad electrode; and pressing an external drive circuit part such that the external drive circuit part is connected to the pad electrode by the adhesive.

10. The method of claim 9, further comprises:

forming a transparent conductive layer over the pad electrode; and performing $H_2$ plasma process or He ashing process on a surface of the transparent conductive layer.

11. The method of claim 9, wherein the plurality of embossing patterns are formed with the passivation layer at a same time.

12. The method of claim 9, wherein the plurality of embossing patterns are formed by patterning the passivation layer formed on an entire surface including the switches.

13. The method of claim 9, wherein the adhesive is an anisotropic conductive film.

14. The method of claim 9, wherein the external drive circuit part is a drive IC or a flexible printed circuit film.

* * * * *

UNITED STATES PATENT AND TRADEMARK OFFICE
CERTIFICATE OF CORRECTION

PATENT NO.        : 7,576,825 B2                                             Page 1 of 1
APPLICATION NO.   : 11/115793
DATED             : August 18, 2009
INVENTOR(S)       : Jung et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 955 days.

Signed and Sealed this

Twenty-third Day of November, 2010

David J. Kappos
*Director of the United States Patent and Trademark Office*